(12) United States Patent
Fang

(10) Patent No.: US 7,301,778 B1
(45) Date of Patent: Nov. 27, 2007

(54) ATCA LOCKING LEVER MOUNTING STRUCTURE

(75) Inventor: Chih-Liang Fang, Hsintien (TW)

(73) Assignee: Adlink Technology, Inc., Taipei Hsien (TW)

( * ) Notice: Subject to any disclaimer, the term of this patent is extended or adjusted under 35 U.S.C. 154(b) by 0 days.

(21) Appl. No.: 11/381,536

(22) Filed: May 4, 2006

(51) Int. Cl.
*H05K 7/10* (2006.01)

(52) U.S. Cl. ............... 361/759; 361/726; 361/732; 361/754; 361/801; 361/798; 361/747; 312/223.2

(58) Field of Classification Search ............... 361/754, 361/726, 732, 740, 747, 759, 798, 801; 312/223.2, 312/223.3
See application file for complete search history.

(56) References Cited

U.S. PATENT DOCUMENTS

| | | | | |
|---|---|---|---|---|
| 4,917,618 A * | 4/1990 | Behrens et al. | ............. | 439/157 |
| 5,139,430 A * | 8/1992 | Lewis et al. | ................ | 439/157 |
| 5,959,843 A * | 9/1999 | Kurrer et al. | ............... | 361/754 |
| 6,094,353 A * | 7/2000 | Koerber et al. | ............. | 361/754 |
| 6,128,198 A * | 10/2000 | Kurrer et al. | ............... | 361/759 |
| 6,220,879 B1 * | 4/2001 | Ulrich | ......................... | 439/160 |
| 6,266,248 B1 * | 7/2001 | Hanas et al. | ................. | 361/752 |
| 6,373,713 B1 * | 4/2002 | Jensen et al. | ................ | 361/759 |
| 6,515,866 B2 * | 2/2003 | Ulrich | ......................... | 361/759 |
| 6,741,479 B2 * | 5/2004 | Korber et al. | ................ | 361/801 |
| 6,924,430 B2 * | 8/2005 | Koerber et al. | ............. | 174/542 |
| 6,961,249 B2 * | 11/2005 | Wong | ......................... | 361/801 |
| 6,992,900 B1 * | 1/2006 | Suzue et al. | ................. | 361/801 |
| 7,054,160 B2 * | 5/2006 | Kim | .......................... | 361/754 |
| 7,130,199 B2 * | 10/2006 | Koerber et al. | ............. | 361/754 |
| 7,142,432 B2 * | 11/2006 | Koerber et al. | ............. | 361/754 |

* cited by examiner

*Primary Examiner*—Dean A. Reichard
*Assistant Examiner*—Dameon E. Levi
(74) *Attorney, Agent, or Firm*—Bacon & Thomas, PLLC

(57) ABSTRACT

An ATCA locking lever mounting structure installed in a motherboard blade formed of a motherboard and a face panel and inserted into a machine case of a server system is disclosed to included a grounding plate fixedly provided at the motherboard near a through hole on the face panel, and a locking lever pivoted to a pivot device at the motherboard and turnable about the pivot device between the locking position where the locking lever locks the motherboard blade to the machine case of the server system and connects the grounding plate to the machine case to have the motherboard be grounded, and the unlocking position where the motherboard blade is unlocked from the machine case.

4 Claims, 6 Drawing Sheets

ATCA LOCKING LEVER MOUNTING STRUCTURE

BACKGROUND OF THE INVENTION

1. Field of the Invention

The present invention relates to blade servers and more specifically, to an ATCA locking mounting structure for enabling a motherboard blade to be locked to a machine case of a server system and electrically connected to the server system quickly without any tools.

2. Description of the Related Art

Currently, many enterprises install relatively cheaper mini servers to satisfy network traffic requirements. In order to improve further economic effect, blade servers are developed. A blade server is essentially a housing for a number of individual minimally-packaged computer motherboard "blades", each including one or more processors, computer memory, computer storage, and computer network connections, but sharing the common power supply and air-cooling resources of the chassis. The idea is that by placing many blades in a single chassis, and then 19-inch rack-mounting them, systems can be more compact and powerful, but less expensive than traditional systems based on mainframes, or server farms of individual computers (see Blade server from Wikipedia).

The most attractive advantage of a blade server is its high reliability and extendibility. Every blade server has the backup function. The hot plugging of the server machine case that supports blade servers and system component parts provides high applicability. When one individual blade server failed, another blade server can take the place without interrupting the service of the system. When wishing to increase the processing power of the system, it needs only to insert more blade servers and to arrange these resources at the place where the demand is heavy.

Because blade servers provide the function of hot plugging function, plug and unplugging actions will be frequently seen in blade servers. The machine case of a blade server has an accommodation chamber and parallel rails arranged at different elevations in the accommodation chamber so that motherboard blades can be inserted into the accommodation chamber along the rails. After insertion of motherboard blades into the accommodation chamber of the machine case, the screws at each motherboard blade are respectively threaded into associating screw holes at the two opposite side panels of the machine case to fix each motherboard blade to the machine case. A motherboard blade generally has a locking lever provided at one side of the board. As shown in FIG. 7, the locking lever A is pivotally connected to one side of the face panel B1 of the motherboard blade B with a screw bolt A2. After insertion of the motherboard blade B in the machine case C of the server system, the locking lever A is biased to force a retaining portion A1 of the locking lever A into engage a part C1 of the machine case C and to touch a sensor switch B2, giving a signal indicative of positive positioning of the motherboard blade B. This locking lever mounting design has drawbacks as follows:

1. The connection area between the locking lever A and the screw bolt A2 wears quickly with use, resulting in vibration of the locking lever A and locking instability.
2. When the connection area between the locking lever A and the screw bolt A2 starts to wear, the locking lever A may be unable to trigger the sensor switch B2 accurately, resulting in operation abnormality of the motherboard blade B.

Therefore, it is desirable to provide an ATCA locking lever mounting structure that eliminates the aforesaid problem.

SUMMARY OF THE INVENTION

The present invention has been accomplished under the circumstances in view. According to one aspect of the present invention, two locking levers are respectively pivotally provided at two sides of the motherboard blade. After insertion of the motherboard blade into the machine case of the server system, the locking levers are turned to the locking position to lock the motherboard blade to the machine case of the server system and to simultaneously switch on sensor switches, thereby connecting the motherboard blade to the server system electrically.

According to another aspect of the present invention, the two locking levers are respectively pivotally provided at the tow sides of the motherboard blade for locking the motherboard blade to the machine case of the server system or unlocking the motherboard blade from the machine case of the server system conveniently without any tools.

According to still another aspect of the present invention, the locking levers connect the motherboard of the motherboard blade to the machine case of the server system for grounding after installation of the motherboard blade in the machine case of the server system, enabling static electricity, noises and magnetic waves to be discharged from the motherboard to the earth through the locking levers and the machine case of the server system.

DETAILED DESCRIPTION OF THE PREFERRED EMBODIMENT

Figure 1:
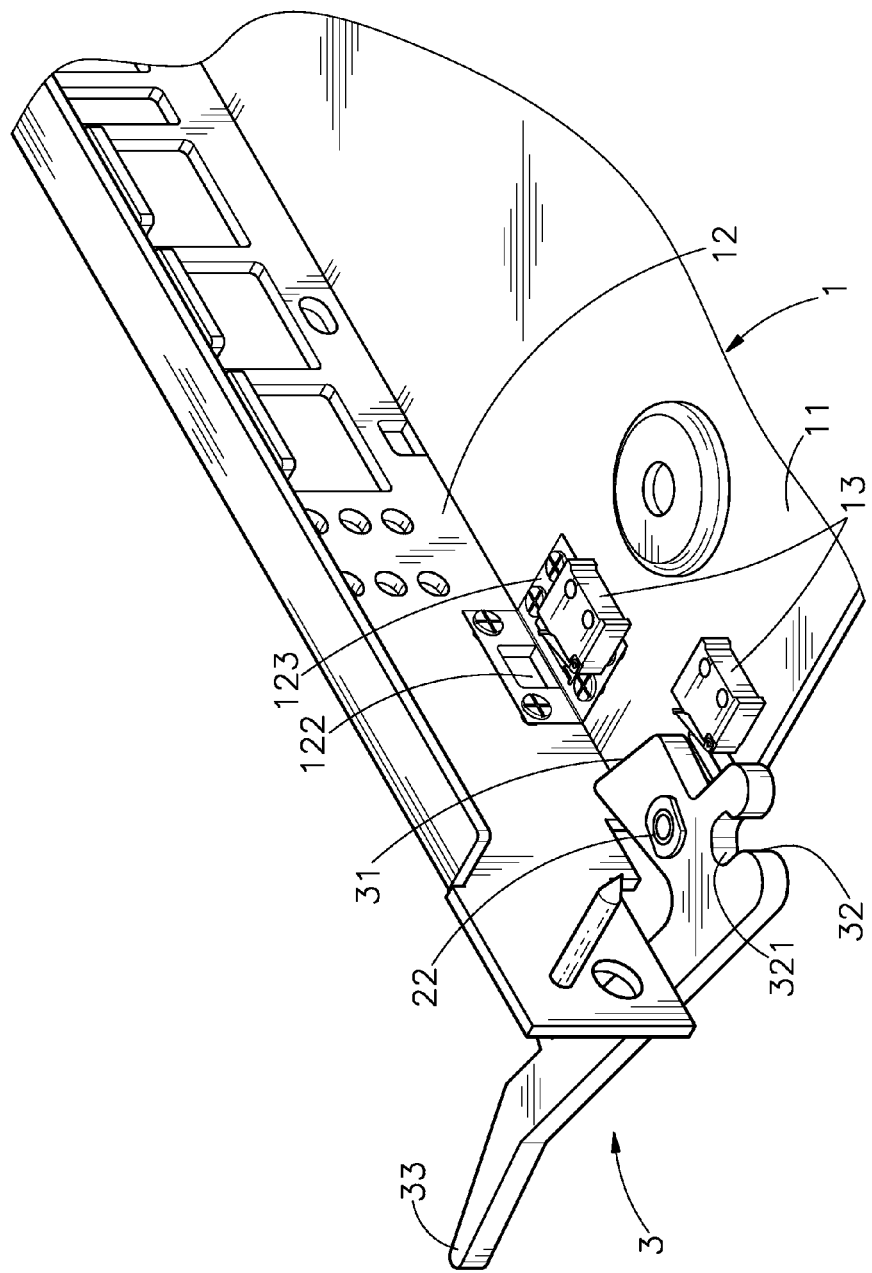
FIG. 1 is an elevational view of an ATCA locking lever mounting structure according to the present invention.
Figure 2:
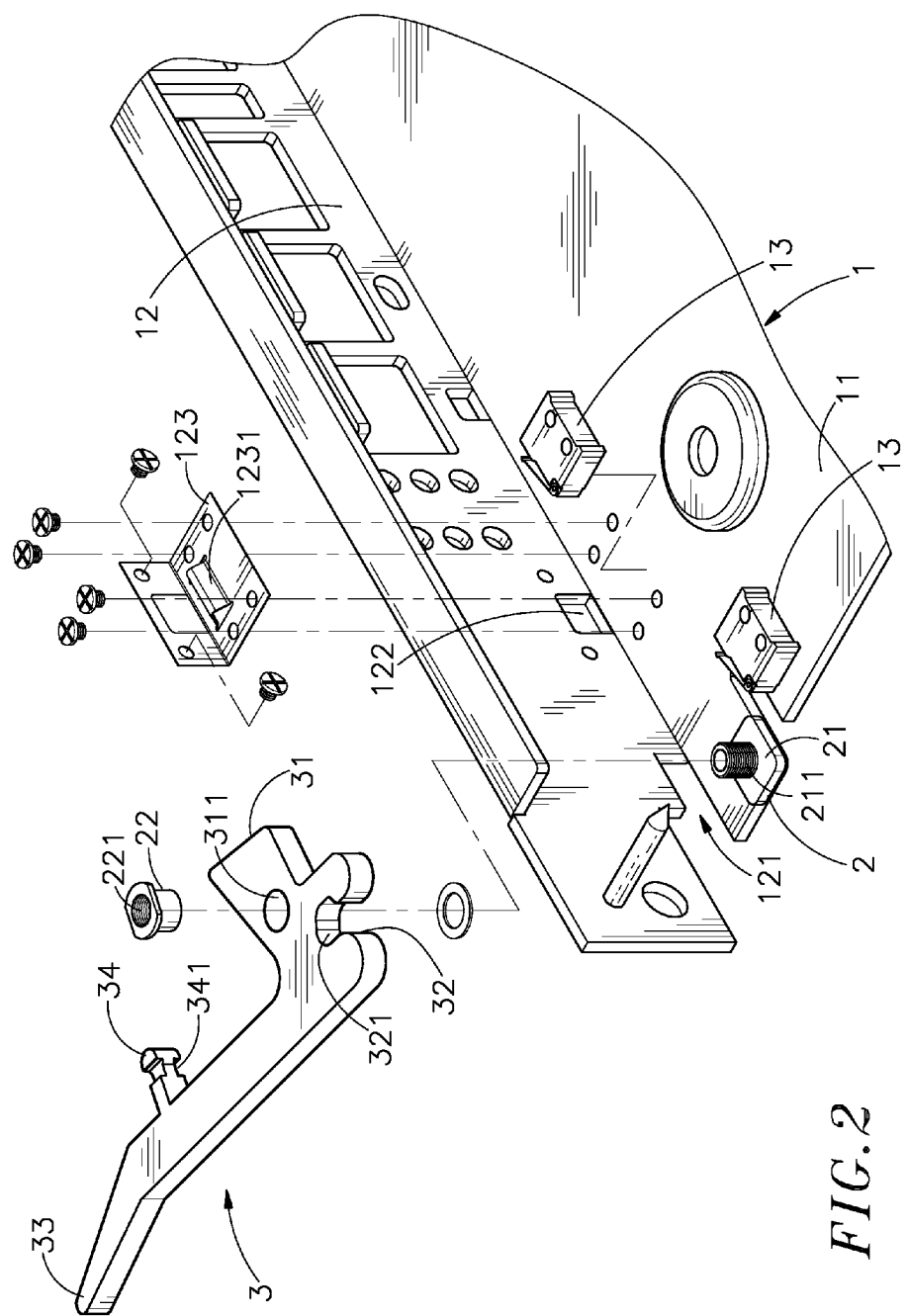
FIG. 2 is an exploded view of FIG. 1.
Figure 3:
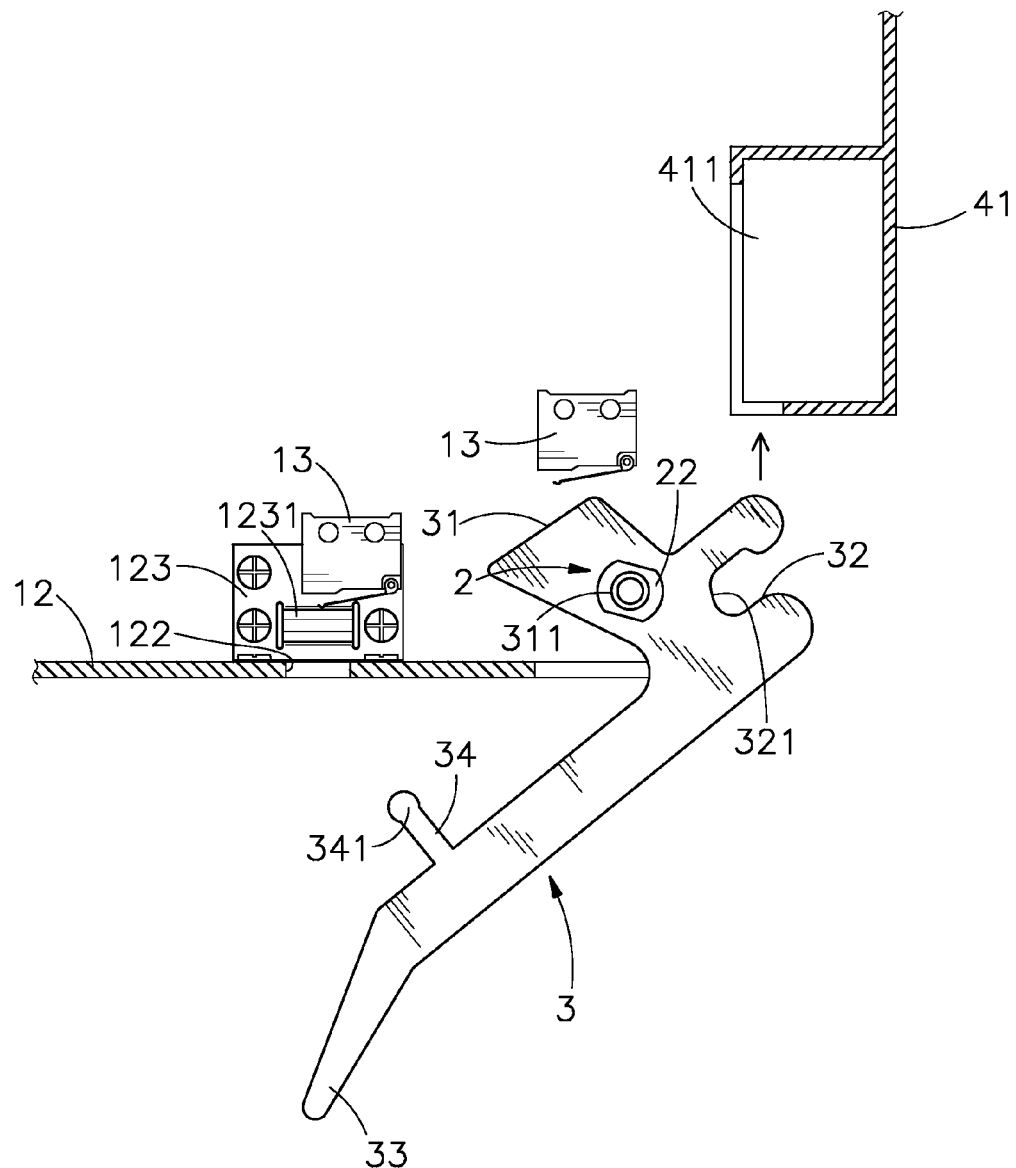
FIG. 3 is a schematic top view of the present invention showing the unlocking status of the locking lever.
Figure 4:
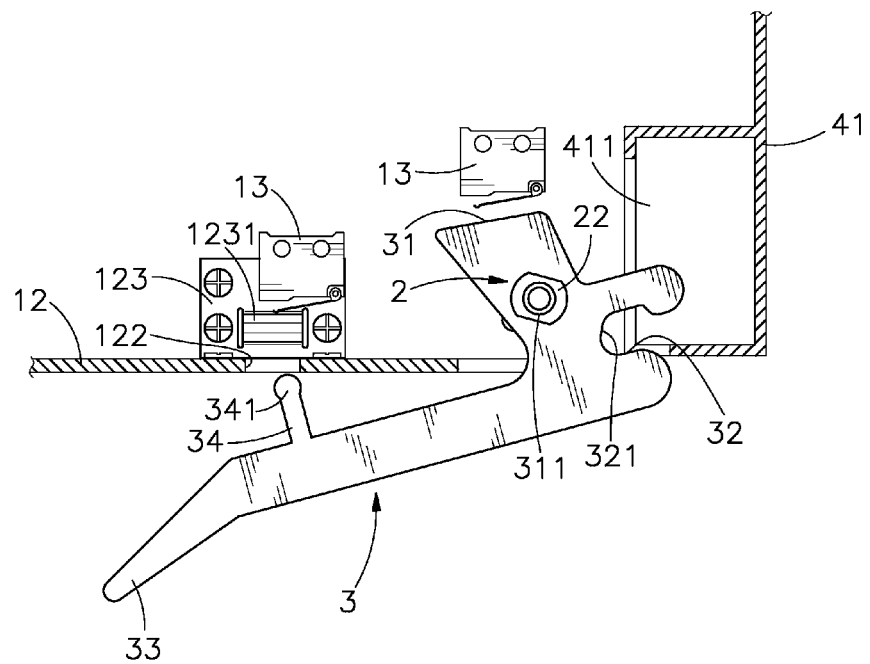
FIG. 4 corresponds to FIG. 3, showing the locking lever turned to the locking position.
Figure 5:
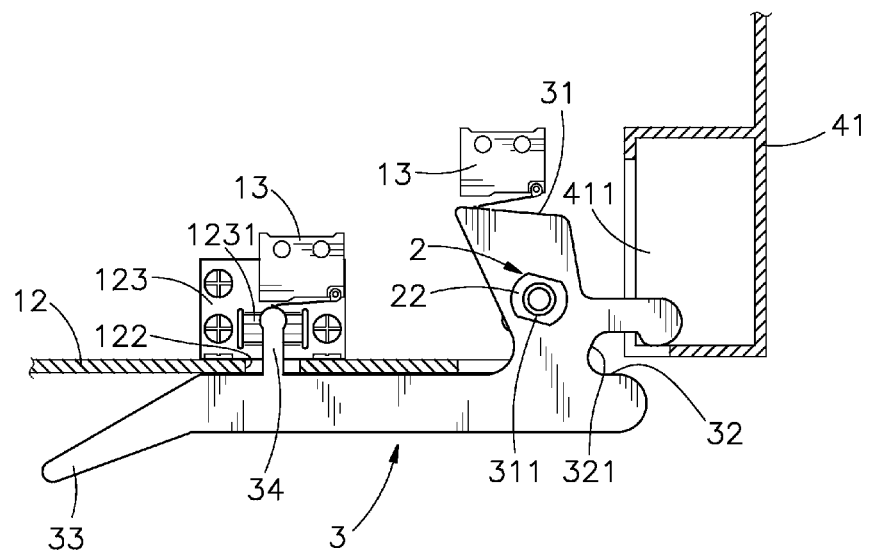
FIG. 5 corresponds to FIG. 4, showing the locking status of the locking lever.

Referring to FIGS. 1~3, an ATCA locking lever mounting structure in accordance with the present invention is shown comprising a motherboard blade 1, a pivot device 2, and a locking lever 3.

The motherboard blade 1 comprises a motherboard 11, which has electronic component parts arranged thereon, a face panel 12, which is provided at one side of the motherboard 11, and at least one, for example, two sensor switches 13, which are mounted on the motherboard 11. The face panel 12 has an end notch 121 at one end thereof adjacent to the motherboard 11, and a through hole 122 near but spaced from the end notch 121 at a distance. A grounding plate 123 is fastened to the abutted area between the motherboard 11 and the face panel 12 corresponding to the through hole 122. The grounding plate 123 has a retaining protrusion 1231.

The pivot device 2 has a mounting base 21 fixedly mounted on the motherboard 11 near the end notch 121 of the face panel 12, a screw rod 211 perpendicularly extending from the mounting base 21, and a bush 22, which has an axial center screw hole 221 threaded onto the screw rod 211.

The locking lever 3 is pivotally coupled to the bush 22 at the pivot device 2, having a push portion 31 at one end, a pivot hole 311 disposed near the push portion 31 and coupled to the bush 22 at the pivot device 2, a grip 33 at the other end, a retaining portion 32 disposed near the pivot hole 311, a C-shaped retaining notch 321 defined in the retaining portion 32, and an engagement rod 34 disposed near the grip 33. The engagement rod 34 has a retaining groove 341 around the periphery.

During installation, the mounting base 21 of the pivot device 2 is affixed to the motherboard 11 of the motherboard blade 1 at a location adjacent to the end notch 121 of the face panel 12, and then the bush 22 is inserted into the pivot hole 311 of the locking lever 3 and threaded onto the screw rod 211 of the pivot device 2. Thus, the user can turn the locking lever 3 about the bush 22 at the pivot device 2 in and out of the end notch 121.

Referring to FIGS. 3~6, after insertion of the motherboard blade 1 into a machine case 41 of a server system 4, turn the grip 33 of the locking lever 3 to force the retaining portion 32 into engagement with a retaining hole 411 of the machine case 41. At this time, the engagement rod 34 is forced into the through hole 122 to switch on one of the sensor switches 13 and to have the retaining groove 341 be engaged with the retaining protrusion 1231 of the grounding plate 123, and the push portion 31 is forced to switch on the other one of the sensor switches 13. Therefore, the sensor switches 13 outputs a signal to the server system 4 indicative of accurate positioning of the motherboard blade 1 in the server system 4, allowing the server system 4 to provide power supply to the motherboard blade 1. By means of engagement between the retaining groove 341 of the engagement rod 34 and the retaining protrusion 1231 of the grounding plate 123, the locking lever 3 guides static electricity and noises from the motherboard 11 to the machine case 41 for discharging to earth, i.e., the motherboard 11 is well grounded against interference of static electricity, noises, and other magnetic waves.

When turning the locking lever 3 about the bush 22 in the reversed direction, the engagement rod 34 and the retaining portion 32 are respectively disengaged from the grounding plate 123 and the machine case 41. At this time, the engagement rod 34 and the push portion 31 are moved apart from the sensor switches 13, causing the sensor switches 13 to disconnect the motherboard blade 1 from the server system 4. Thus, the user can directly take the motherboard blade 1 out of the machine case 41 for a repair or maintenance work. Therefore, mounting and dismounting of the motherboard blade 1 are simple without tools.

Further, the aforesaid locking lever 3 can be made in the shape of a flat bar or round rod. Preferably, the locking lever 3 is made of metal, and turnable about the bush 22 at the pivot device 2 in and out of the end notch 121 between the locking position where the sensor switches 13 switch on electric connection between the motherboard blade 1 and the server system 4 and the locking lever 3 locks the motherboard blade 1 to the machine case 41, and the unlocking position where the sensor switches 13 switch off electric connection between the motherboard blade 1 and the server system 4 and the locking lever 3 unlocks the motherboard blade 1 from the machine case 41.

Figure 6:
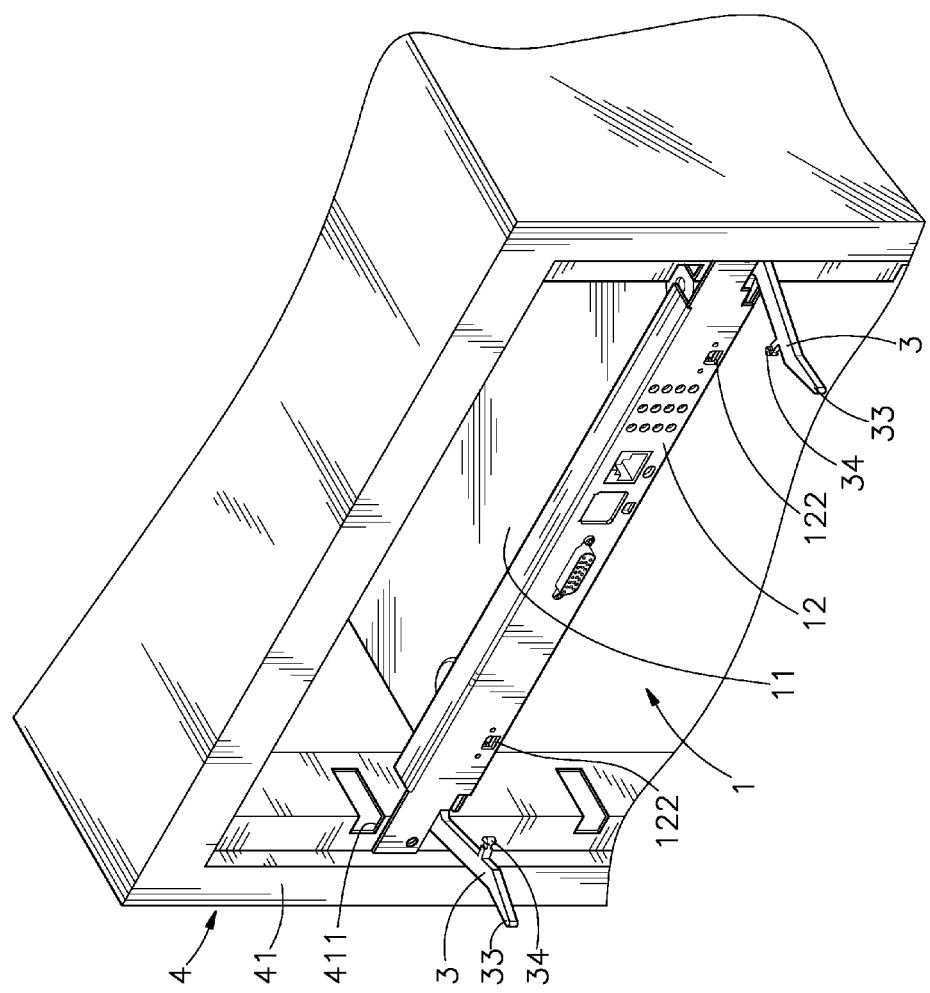
FIG. 6 is a schematic view showing the motherboard blade installed in the machine case of the server system, the two locking levers of the motherboard blade locked.
Figure 7:
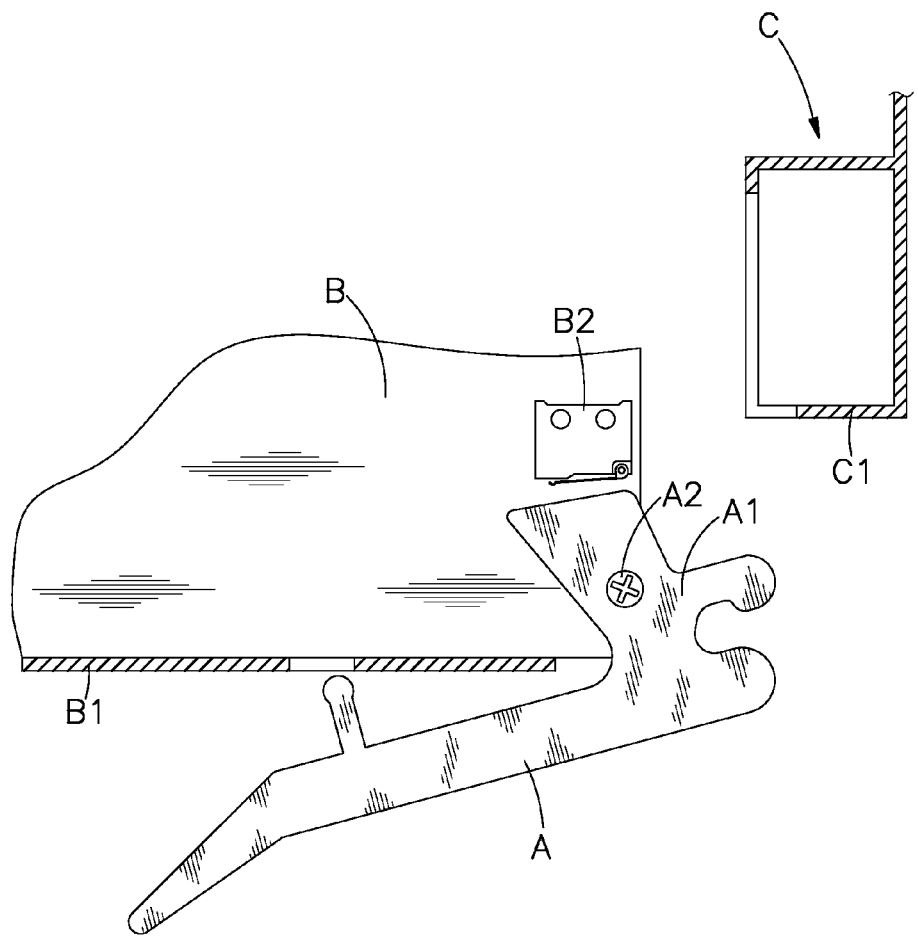
FIG. 7 is a schematic drawing of a prior art design.

In actual practice, as shown in FIG. 6, two locking levers 3 are used and provided at two sides of the motherboard blade 1 so that the locking levers 3 can positively lock the motherboard blade 1 to the machine case 41 of the server system 4.

As indicated above, the ATCA locking lever mounting structure of the present invention has the following features:

1. Two locking levers are respectively pivotally provided at two sides of the motherboard blade. After insertion of the motherboard blade into the machine case of the server system, the locking levers are turned to the locking position to lock the motherboard blade to the machine case and to simultaneously switch on sensor switches, thereby connecting the motherboard blade to the server system electrically.

2. The two locking levers are respectively pivotally provided at the tow sides of the motherboard blade for locking the motherboard blade to the machine case of the server system or unlocking the motherboard blade from the machine case of the server system conveniently without any tools.

3. After installation of the motherboard blade in the machine case of the server system, the locking levers connect the motherboard of the motherboard blade to the machine case of the server system for grounding, enabling static electricity, noises and magnetic waves to be discharged from the motherboard to the earth through the locking levers and the machine case of the server system.

A prototype of ATCA locking lever mounting structure has been constructed with the features of FIGS. 1~6. The locking lever and base frame board mounting arrangement for ATCA board functions smoothly to provide all of the features disclosed earlier.

Although a particular embodiment of the invention has been described in detail for purposes of illustration, various modifications and enhancements may be made without departing from the spirit and scope of the invention. Accordingly, the invention is not to be limited except as by the appended claims.

What the invention claimed is:

1. An ATCA (Advanced Telecom and Computing Architecture) locking lever mounting structure installed in a motherboard blade formed of a motherboard and a face panel at one side of said motherboard and adapted to lock said motherboard blade to a machine case of a server system and to connect said motherboard to said machine case for grounding, the ATCA locking lever mounting structure comprising:

a pivot device, said pivot device having a mounting base fixedly mounted on said motherboard, and a screw rod perpendicularly extending from said mounting base; a bush threaded onto said screw rod of said pivot device; and a locking lever pivotally coupled to said bush at said pivot device and turnable about said bush between a locking position to lock said motherboard blade to said machine case and an unlocking position to unlock said motherboard blade from said machine case, said locking lever having a pivot hole coupled to said bush, and a retaining portion for engaging a part of said machine case to lock said motherboard blade to said machine case, and an engagement member for engaging a part of said motherboard blade upon engagement of said retaining portion with said machine case;

wherein said locking lever further has a push portion for switching on/off a respective sensor switch at said motherboard subject to locking/unlocking position of said locking lever; said retaining portion of said locking lever defines a C-shaped retaining notch; and wherein said motherboard has two sensor switches respectively corresponding to said push portion and engagement member of said locking lever.

2. The ATCA locking lever mounting structure as claimed in claim 1, wherein said locking lever is formed of a metal plate member.

3. The ATCA locking lever mounting structure as claimed in claim 1, further comprising a grounding plate affixed to said motherboard corresponding to a through hole on said face panel, said grounding plate having a retaining protrusion for engaging the engagement member of said locking lever upon engagement of said retaining portion of said locking lever with said machine case.

4. The ATCA locking lever mounting structure as claimed in claim 1, wherein said pivot device is mounted on said motherboard adjacent to an end notch at one side of said face panel so that said locking lever is movable in and out of said end notch of said face panel when turned about said bush at said pivot device.

* * * * *